United States Patent
Gostin et al.

(10) Patent No.: US 9,690,673 B2
(45) Date of Patent: Jun. 27, 2017

(54) SINGLE AND DOUBLE CHIP SPARE

(76) Inventors: Gary Gostin, Plano, TX (US); Erin A. Handgen, Fort Collins, CO (US)

(*) Notice: Subject to any disclaimer, the term of this patent is extended or adjusted under 35 U.S.C. 154(b) by 315 days.

(21) Appl. No.: 14/365,191

(22) PCT Filed: Jan. 31, 2012

(86) PCT No.: PCT/US2012/023313
§ 371 (c)(1),
(2), (4) Date: Jun. 13, 2014

(87) PCT Pub. No.: WO2013/115790
PCT Pub. Date: Aug. 8, 2013

(65) Prior Publication Data
US 2015/0006977 A1    Jan. 1, 2015

(51) Int. Cl.
| | |
|---|---|
| G06F 11/00 | (2006.01) |
| G06F 11/16 | (2006.01) |
| G11C 29/00 | (2006.01) |
| G06F 3/06 | (2006.01) |
| G06F 11/10 | (2006.01) |

(52) U.S. Cl.
CPC ........ *G06F 11/1666* (2013.01); *G06F 3/0619* (2013.01); *G06F 3/0658* (2013.01); *G06F 3/0683* (2013.01); *G06F 11/1064* (2013.01); *G11C 29/808* (2013.01); *G06F 11/1068* (2013.01)

(58) Field of Classification Search
CPC combination set(s) only.
See application file for complete search history.

(56) References Cited

U.S. PATENT DOCUMENTS

| | | | |
|---|---|---|---|
| 4,608,687 A | 8/1986 | Dutton | |
| 5,917,838 A | 6/1999 | Wardrop | |
| 7,292,950 B1* | 11/2007 | Resnick | ............. G06F 11/1044 700/1 |
| 7,483,319 B2 | 1/2009 | Brown | |
| 7,523,364 B2 | 4/2009 | Alves et al. | |
| 8,010,875 B2 | 8/2011 | Gara et al. | |
| 8,041,990 B2 | 10/2011 | O'Connor et al. | |
| 2004/0088636 A1 | 5/2004 | Cypher | |
| 2004/0163028 A1 | 8/2004 | Olarig | |
| 2006/0053246 A1 | 3/2006 | Lee | |
| 2008/0181015 A1 | 7/2008 | Lee | |

(Continued)

FOREIGN PATENT DOCUMENTS

| | | |
|---|---|---|
| CN | 1150690 A | 5/1997 |
| TW | 200723288 A | 6/2007 |

OTHER PUBLICATIONS

Extended European Search Report dated Mar. 11, 2016, Application No. 15198293.1, 8 pages.

(Continued)

*Primary Examiner* — Michael Maskulinski
(74) *Attorney, Agent, or Firm* — Hewlett Packard Enterprise Patent Department

(57) ABSTRACT

Techniques are provided for overcoming failures in a memory. One portion of the memory may operate in a single chip spare mode. Upon detection of an error in a single chip in the portion of the memory, a region of the portion of the memory may be converted to operate in a double chip spare mode. The memory may be accessed in both single and double chip spare modes.

18 Claims, 8 Drawing Sheets

(56) References Cited

U.S. PATENT DOCUMENTS

| | | |
|---|---|---|
| 2009/0217281 A1 | 8/2009 | Borkenhagen |
| 2010/0293438 A1 | 11/2010 | Lastras-Montano et al. |
| 2011/0090751 A1 | 4/2011 | Manna et al. |
| 2011/0164450 A1* | 7/2011 | Norman ............... G11C 29/808 365/185.09 |
| 2011/0320864 A1* | 12/2011 | Gower ................. G06F 11/073 714/6.12 |
| 2011/0320869 A1* | 12/2011 | Gower ............... G06F 11/1044 714/16 |

OTHER PUBLICATIONS

International Preliminary Report on Patentability received in PCT Application No. PCT/US2012/023313, Aug. 14, 2014, 7 pages.
Extended European Search Report dated Aug. 11, 2015; EP Application No. 12867410.8; 6 pages.
International Searching Authority, The International Search Report and the Written Opinion, Jan. 3, 2013, 10 Pages.

\* cited by examiner

SINGLE AND DOUBLE CHIP SPARE

BACKGROUND

Computing devices may suffer from any number of different types of failures. One particular type of failure is failure in the memory chips that make up the memory system. Failures of individual memory chips may reduce the amount of memory available to the system. As memory chips are generally not individually serviceable, replacement of a failed memory chip may require the complete replacement of a memory module that may contain many non-failed chips. Furthermore, memory is typically not serviceable while the computer is operational and thus may require downtime to carry out the replacement of the failed memory modules.

DETAILED DESCRIPTION

Figure 1:
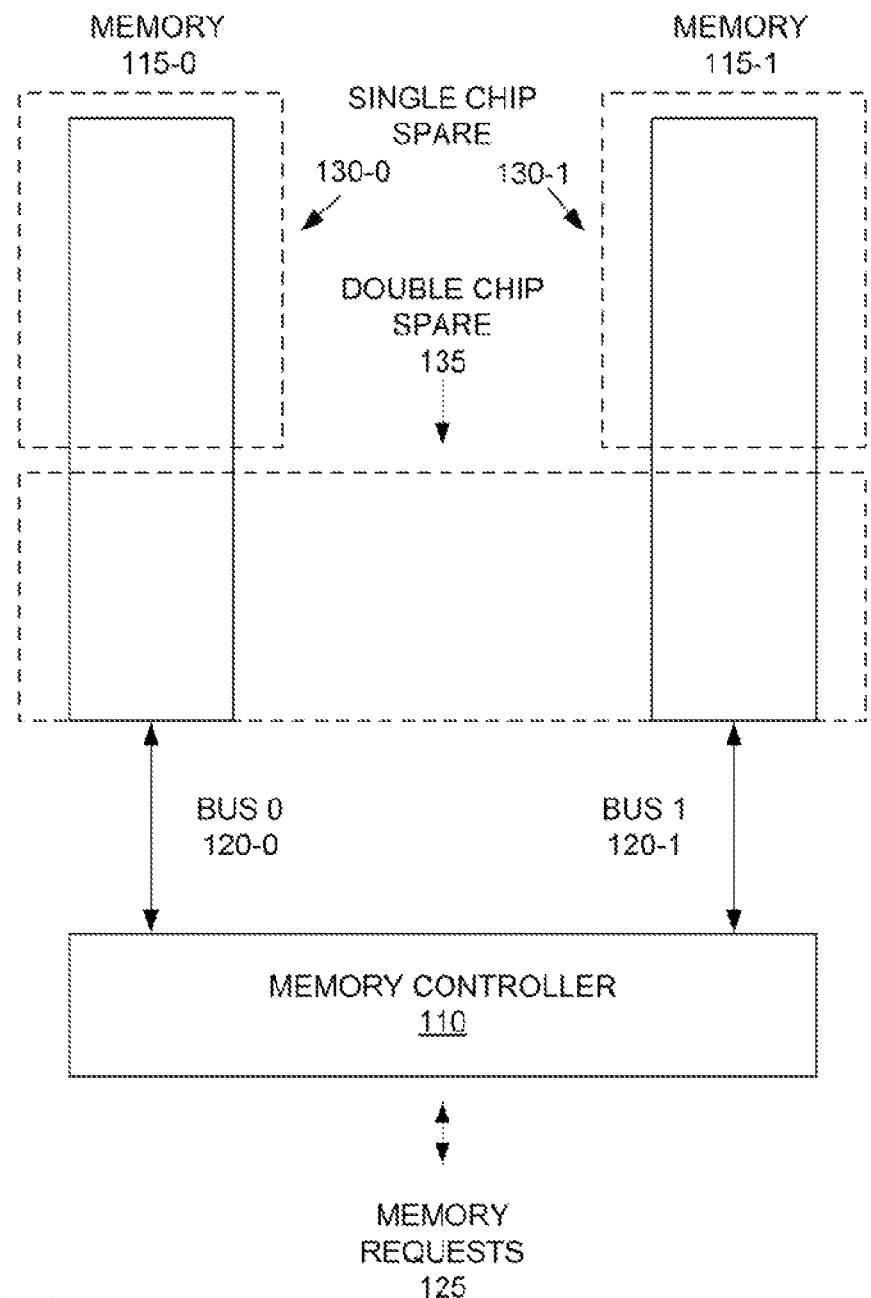
FIG. 1 depicts a block diagram of an example of a memory system.

Memory failures in computing systems may lead to unplanned system downtime, due to the need to replace faulty memory components. Unplanned downtime in today's computing environment, in which high availability of computing systems is expected, may be intolerable. Problems due to memory failure may be further exacerbated when the failures occur in server systems, as many different users may be impacted by system downtime. In addition, many organizations rely on continuous availability of applications running on their computers in order to achieve the organization's goals. Unplanned downtime due to memory failure can be detrimental to those goals.

To mitigate the effects of failure of memory, several techniques are available. One such technique may be referred to as Single Chip Spare (SCS). In SCS systems, a memory controller may store cache lines in the memory such that failure of any single memory chip does not result in the cache line becoming unusable. For example, the cache lines may be stored in memory with the protection of an Error Correction Code (ECC). An ECC that is capable of detecting and correcting a failure of a single chip may be chosen from a number of available error correction codes. Upon a failure of a chip in a memory, the ECC may be used to ensure that the cache lines are still usable.

An SCS system is able to continue running even in the presence of a failure of a single memory chip within an ECC codeword. Furthermore, SCS systems are able to utilize the bandwidth between the memory and the memory controller in a highly efficient manner. However, SCS systems suffer from the inherent problem that they can only recover from a single chip failure within an ECC codeword. Failure of a second memory chip within the codeword may, at minimum, result in the need for system downtime to replace the faulty memory.

Another technique that may be used to mitigate failures in memory may be referred to as Double Chip Spare (PCS). In DCS, cache lines are again stored in memory with the protection of one of many known error correction codes that are capable of detecting and correcting for up to two memory chip failures within each ECC codeword Error correction codes that are capable of correcting faults in two error chips typically distribute a cache line across a larger number of chips, in comparison to SCS, to reduce the number of bits that are corrupted when a chip fails. For example, a cache line may be distributed between chips contained on two separate memory busses or between chips on a single bus but spread between addresses on a single bus such that any error of two chips storing the cache line does not make the line unusable. The cache line distribution can occur between memory modules on different buses, different memory modules on the same bus, or different ranks on the same memory module.

DCS has the advantage of being able to survive failures in two memory chips within an ECC codeword before requiring downtime for repair. Thus, a first failure may occur, and the system may continue to operate. Even when a second failure occurs, the system continues to operate. Thus, a system administrator may be given a wider window of opportunity to address a memory failure during a planned maintenance period, as compared to SCS. The failure of the first memory chip does not result in a situation where the next failure may cause the system to be unusable. Maintenance may not be, needed until the failure of a second chip. which may not occur until a considerable amount of time after the first chip failure.

However, the increased protection offered by DCS comes at a price. As mentioned, DCS operates by storing cache lines across multiple busses or multiple distinct ranges of memory addresses within a single bus. The heed to access multiple busses or address ranges results in inefficiencies in the transfer of data from the memory to the memory controller, as extra cycles are needed to configure reading from/writing to different busses or different ranges on a single bus. As much as 40% of the bus bandwidth, may be lost in order to gain the protection of DCS. The loss of bus bandwidth occurs even if there has not yet been a failure of any memory chip.

Techniques provided herein overcome the problems created by SCS and DCS, while at the same time retaining the advantages provided by those two mechanisms. A memory may initially operate in SCS mode, providing the the benefits, such as full bus utilization, described above. When a failure in a single chip in memory occurs, the portion of the memory affected by the failure may be converted to DCS mode. Portions of memory that are not affected remain operating in SCS mode. Thus, full bandwidth is maintained for those portions of memory that are not affected by the failure of the memory chip, maintaining the advantages of SCS to the extent possible. Likewise, for the portion of the memory that contains a faulty memory chip, the conversion to DCS retains the advantage that the next failure of a memory chip is not critical, as a failure of an additional memory chip can be accommodated. The techniques above are described in further detail below and in conjunction with the attached figures.

FIG. 1 depicts a block diagram of an example of a memory system. The system may include a memory controller 110, memories 115-0, 115-1, and busses 120-0, 120-1 which connect the memory controller to the memories. Memory controller may receive request 125 to read write cache lines in the memory from external sources. For example memory requests may come from sources such as processors, direct memory access controllers, or other such devices.

The memory controller may typically be implemented in hardware. Due to the processing speed requirements needed in today's computing environment, the memory controller may generally be implemented as an application specific integrated circuit (ASIC) or may be included as part of a larger device, such as a processor. The memory controller may contain memory, general purpose processors, and dedicated control logic. In addition, the memory controller may execute software or firmware to aid in providing the functionality described herein. The various functions that are described may be implemented using any combination of the memory, processors, software, firmware, and logic as needed.

The memory controller 110 may access the memory 115 over one or more busses. Upon receiving a memory request, the memory controller may access the memory in order to service the request. For example, in the case of a request to read a cache line from memory, the memory controller may retrieve the cache line from the memory over the bus, compute the appropriate ECC based on the mode of operation, compare the computed ECC and ECC retrieved with the cache line, correct any errors to the extent possible given the type of ECC, and provide the cache line to the requestor. In the case of a request to write to memory, the memory controller may receive a request to write a cache line, compute an appropriate ECC and store the cache line in the memory.

In the description above reference was made to an appropriate ECC. As was mentioned above, error correction codes are available for both SCS and DCS. Cache lines may be stored in either SCS mode 130-0,1 or DCS mode 135 in the memory, When reading or writing cache lines, the memory controller may select the proper ECC to use based on if the cache line is contained in a SCS or DCS portion of the memory. Thus, the memory controller is able to access some portions of the memory in SCS mode and other portions of the memory in DCS mode. In addition, upon failure of a chip in the SCS portion of memory, the memory controller may convert a region of memory from SCS mode to DCS mode. Access of the memory in SCS and DCS mode, along with conversion from one mode to the other, is described in further detail below.

Figure 2:
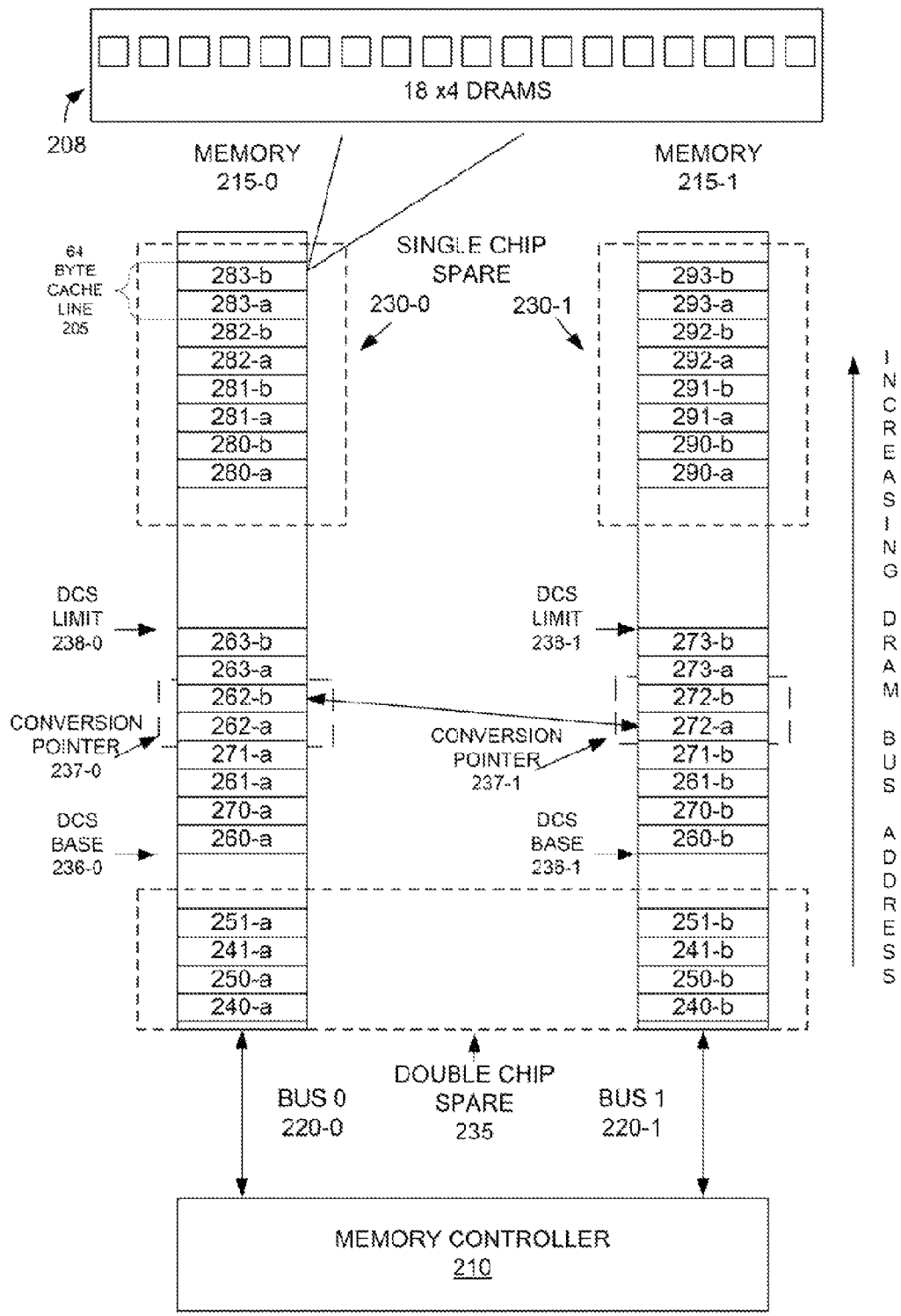
FIG. 2 depicts another block diagram of an example of a memory system with a chip failure.

FIG. 2 depicts another block diagram of an example of a memory system with a chip failure. In a typical memory system, cache lines containing sixty four bytes of data 205 may be used. A cache half line, as the name implies, is half of a complete cache line. For example, as shown the sixty four byte cache line 283 may he made up of half cache lines 283-a,b. For purposes of the remainder of this disclosure, references to a cache line by number only indicate the full cache line, while references to the number and a letter indicate reference to a single half cache line.

The cache half lines may be stored in a memory 215-0,1. An example of a typical chip layout of a memory using eighteen ×4 Dynamic Random Access Memory (DRAM) chips 208 is shown, In such an implementation sixteen of the memory chips may be used to store cath while two of the memory chips are used to store an ECC. Given a total of eighteen chips, there are many known single chip error correction codes that can detect and correct a failure in a single chip.

Cache lines 280-283 may be stored in memory 215-0. Cache lines 280-283 may be protected by any available ECC that is able to detect and correct a single chip error. Cache lines 280-283 may form a first SCS region 230-0. Likewise, cache Ines 290-293 may be stored in memory 215-1. Cache lines 290-293 may also be protected by a single chip spare ECC and form a second SCS region 230-1. Each of these sets of cache lines is operating in single chip spare mode, as failure of any single chip in these regions does not render the cache lines stored therein unusable. The two SCS regions 230-0,1 are independent of each other.

Double chip spare region 236 is an example of a region that is protected by an ECC that is capable of detecting and correcting failures in up to two chips. This DCS region comprises cache lines within two address ranges: 240-241 and 250-251. As shown, each cache line is spread across two memory busses. For example, cache half lines (240,250,241, 251)-a are stored in memory 215-0, while cache half lines (240,250,241,251)-b are stored in memory 215-1, Thus, a given cache line in a DCS region is stored across a total of thirty six chips, with thirty two chips used for data and four chips used to store an ECC. Given this number of chips, error correction codes that are able to detect and correct for failures of up to two chips are available. Cache lines 240-241 and 250-251 are protected by such an ECC.

When a single chip in an SCS region fails, the region may be converted from SCS mode to DCS mode, thus protecting the cache ones in the region from a subsequent chip failure When a single chip in an SCS region fails, a DCS base 236-0 may be determined. In addition, a DCS limit 238-0 may be determined. Selection of the DCS base and limit will be described in further detail below, but for now, the DCS base and limit determine the beginning and end of the SCS region of memory that will be converted to DCS. For purposes of this description, assume that there has been a failure of a single chip within memory 215-0 on bus 220-0, and that failure affects the region between the DCS base 236-0 and the DCS limit 238-0 and will be referred to as the first region.

A second region may be selected that is equal in size to the region containing the failure. The second region may also be identified by a DCS base 236-1 and a DCS limit 238-1. In one example, the second region may be the identical address range of the first region, except for being on a different bus 220-1. However, this specific arrangement is not required. Examples of additional possibilities are described with respect to FIGS. 3(a-b). The two sets of DCS base and DCS limit addresses together define the DCS region.

Conversion pointers 237-0,1 may be set to point to the DCS bases 236-0,1 respectively. The conversion pointers may advance from the DCS bases to the DCS limits, converting cache lines from SCS mode to DCS mode as they advance. The process of converting cache lines may be best explained though the use of an example. As shown, the conversion pointer 237-0 currently points to cache line 262. The corresponding conversion pointer 237-1 currently points to cache line 272. The memory controller 210 may swap one half of each cache line between the first and second region. For example, as shown, cache half line 272-a may be swapped with cache half line 262-b using the following procedure. Cache lines 252 and 272 are each read from memory and corrected using their corresponding SCS ECC, if needed. A DCS ECC is then calculated for each cache line. The resulting cache lines are then written back to memory. When the cache lines are written back to memory, they are distributed across the first and second regions. The conversion pointers may then be advanced by one cache line. The end result of this swap being that cache tines 262, 272 are now spread across both regions of memory. The process may repeat until the conversion pointers point to the DCS conversion limits, An example of cache hoes that have already been swapped are cache lines 260, 261, 270, 271. Cache lines that are waiting to be converted are lines 263, 273.

In the process of swapping the cache lines described above, a new error correction code was computed However, because the cache lines are now spread across an increased number of chips, a DCS error correction code may be used. Once the conversion of a pair of cache lines to DCS mode is complete, the cache lines are then able to withstand the failure of any additional chip.

While the conversion is in process, any memory access requests to bus addresses that are above the DCS bases, but below the DCS conversion pointers will be processed as access requests to a DCS region. Likewise, any memory access requests to bus addresses that are above the conversion pointers, but below the DCS limits will be processed as access requests to a SCS region. A memory request to a bus address that is pointed to by the conversion pointers, meaning that the address is in the process of being converted, will stall and will be retried at a later time. By the time the request is retried, the conversion will have likely completed. If the conversion has not completed, the request will continue to stall until such time as the conversion of the bus address is complete.

The DCS bases and limits were briefly mentioned above. The DCS bases and limits determine the extent of the regions that will be converted from SCS mode to DCS mode. As mentioned above, the use of DCS is not without penalty, In particular, DCS regions suffer from reduced bandwidth utilization due to the need to reconfigure the memory controller to access locations on different busses. As such it is desirable to limit the size of the region being converted to DCS to minimize the impacts of reduced bus utilization.

The techniques described herein select a size of the conversion region based on the extent of the memory chip failure. For example, an individual memory chip may contain individual banks that can fail independently. In the case of a failure of a single bank within a single chip, the first region may be selected to encompass only that bank. It multiple consecutive banks fail, the first region may include multiple banks. If the entire chip fails, the first region may include the entire chip. What should be understood is that the first region may be selected to be as small as possible while still covering all memory locations that are impacted by the failure.

FIG. 2 was presented in terms of an example implementation of a memory system typically used in computing systems, however it should be understood that the techniques described herein are not limited to any particular chip configuration, cache line size, or number of busses.

Figure 3A:
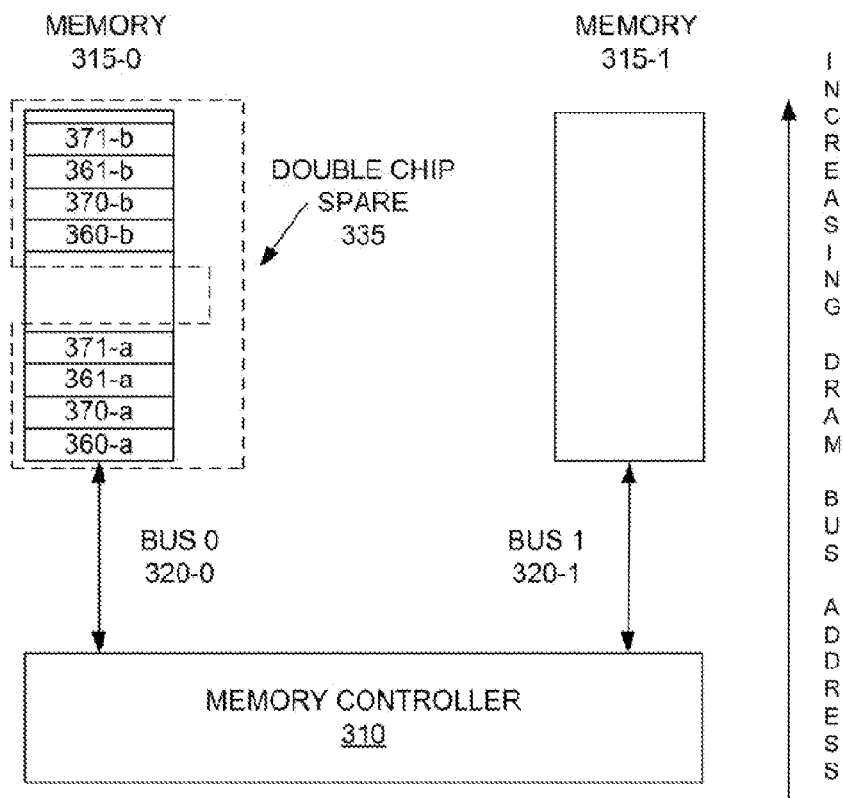
FIGS. 3(a-b) depict addition examples of a memory system with chip failures.
Figure 3B:
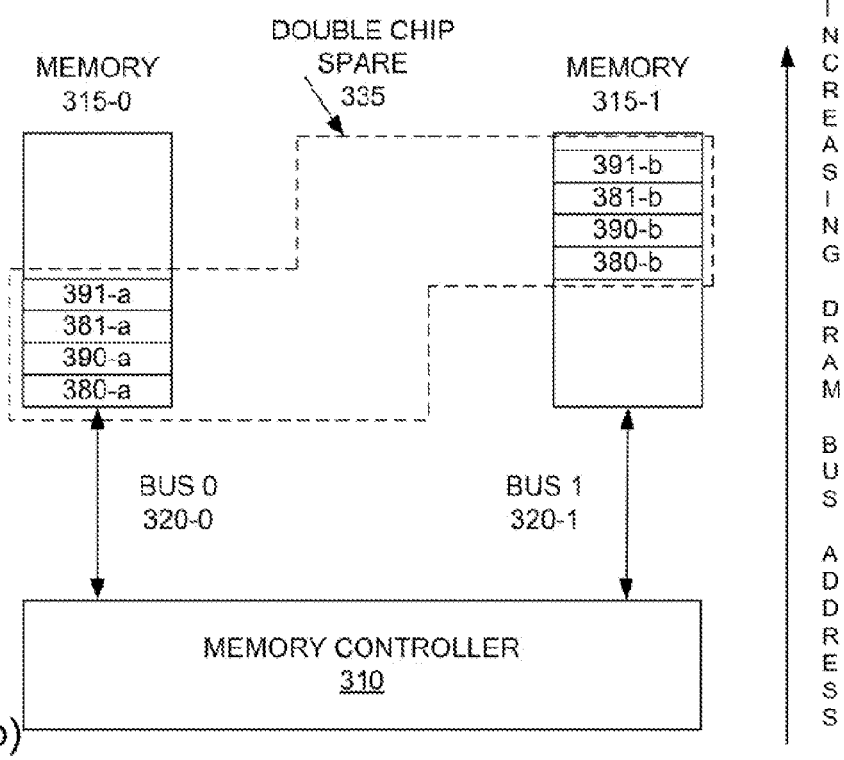

FIGS. 3(*a-b*) depict additional examples of a memory system with chip failures. In the description of FIG. 2, it was assumed that conversion of two SCS regions to a DCS region was between memories located on two separate busses, and that both SCS regions are at the same relative memory addresses on their bus. However, the techniques described herein are not limited to such configurations, and may be used with any number of other configurations. What should be understood is that any configuration of memories, busses, and addresses may be used, as long as an additional chip failure will not affect the ability of the ECC to correct for an error. In general terms, any memory configuration in which a cache line is re-distributed over a collection of memory chips to increase the number of detectable and/or correctable memory chip errors is acceptable.

FIG. 3(*a*) depicts an example of a double chip spare region 335 that contained in memory 315-0 on a single memory bus 320-0. As shown, cache half lines (360, 370, 361, 371)-*a* are stored in one range of bus addresses. Cache half lines (360, 370, 361, 371)-*b* are stored in a different, range of bus addresses. The configuration shown in FIG. 3(*a*) is usable with the techniques described herein, so long as any memory chip failure will not affect both halves of the cache line. The reason the configuration is valid is that when operating in DCS mode in accordance with the techniques described, the cache line has already experienced an error in one chip which affects only one half of the cache line. If an additional chip fails, the failure will also only affect one half of the cache line. Thus, the entire cache line will experience, at most, two chip failures, which can be corrected by the memory controller 310 when using DCS error correction codes.

FIG. 3(*b*) depicts another example of a double chip spare region 335 that is contained in memory 315-0,1 on two memory busses 320-0,1, but the addresses on those busses are not the same. As shown, cache half lines (380, 390, 331, 391)-*a* are stored in memory on one bus. Cache half lines (380, 390, 381, 391)-*b* are stored in memory on a different bus. As should be clear, any additional chip failure will affect at most one half of a cache line, as the cache line halves stored in chips on different busses are independent of each other. Furthermore, it is not necessary for the bus address ranges to be the same, as was described with respect to FIG. 2. The memory controller 310 may store the address ranges that form the DCS region. Thus, when a memory request is received, the proper bus addresses may be accessed to provide the complete cache line.

Figure 4A:
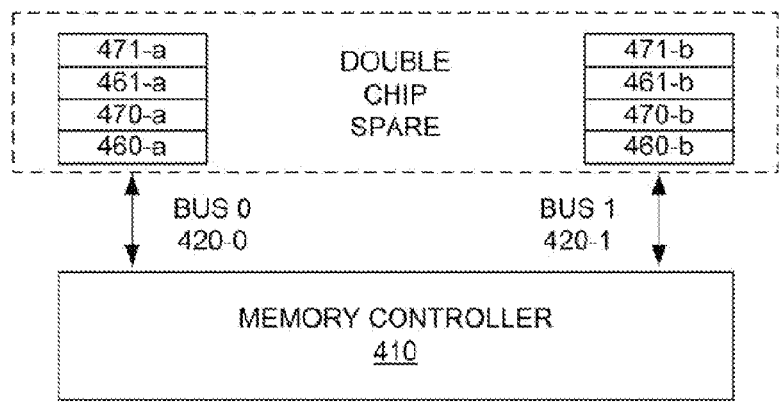
FIGS. 4(a-c) depict an example of a memory system with multiple chip failures.
Figure 4B:
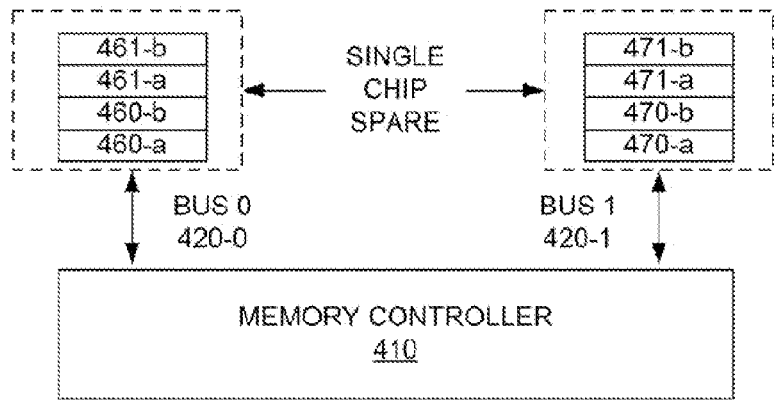
Figure 4C:
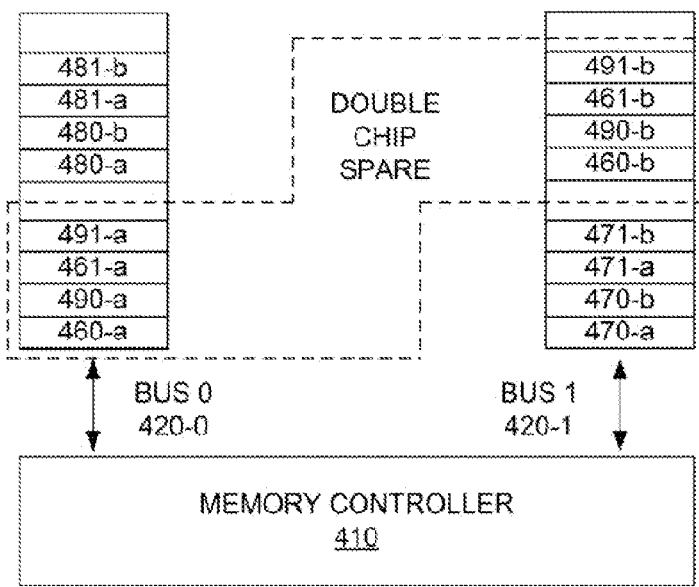

FIGS. 4(*a-c*) depict an example of a memory system with multiple chip failures, As mentioned above, the techniques described herein allow for up to two memory chip failures before repairs are needed. However, in some circumstances, it may be possible to reconfigure the DCS regions such that additional chip failures may occur and yet still allow the system to remain operational.

FIG. 4(*a*) depicts a system in which a region of memory has been converted to operate in DCS mode in accordance to the techniques presented above As shown, cache half lines (460, 470, 461, 471)-*a* are stored in memory on one bus 420-0 and cache half lines 460, 470, 461, 471)-*b* are stored in memory on a different bus 420-1 For purposes of this description, assume that there has only been one chip failure so far, thus the protection provided by DCS is still available. In other words, assume that there is only a failure of a single chip on a single bus and the memory controller 410 can correct the error using the DCS ECC.

At some point in time, there may be a second chip failure. In cases where the second chip failure occurs on the bus opposite the one that contains the first chip failure, the DCS region may be converted back to two SCS regions, since the ECC for the two SCS regions will be sufficient to correct errors caused by the two failed chips. Each of the two SCS regions may now be converted into a separate DCS region using another error-free SCS region, thus extending the period of DCS protection.

As shown in FIG. 4(*b*) assume that there is a failure of a single chip on bus 420-0 and a single chip on bus 420-1. The process of converting the region to DCS could then be executed in reverse, resulting in two SCS regions. As shown, cache half lines are swapped such that both halves of a cache line are contained in a single SCS region. As shown, cache lines 460,461 are now contained in a first SCS region, while cache lines 470,471 are contained in a second SCS region. It should be understood that each of the SCS regions now has a single chip failure, and as such failure of an additional chip may cause the cache lines to become unusable.

However, if another region can be found that does not contain any chip errors, the process of converting the SCS regions back to DCS regions can occur again. As shown in FIG. 4(*c*) a third error free region, containing cache lines 480,481 may be identified. The cache half lines that made up cache lines 480, 481 may be exchanged with the cache half lines that made up cache lines 470, 471 in accordance with the procedure described above to form a new DCS region. Likewise, a fourth error free region, originally containing cache lines 490, 491 may be identified. Again, the procedure described above to swap cache lines between the region originally containing cache lines 460, 461 and the region containing cache lines 490, 491 may be executed. The result is a new double chip spare region, as shown by the dashed lines.

The process of converting a DCS region back into two SCS regions, and then reconverting back into a DCS region may continue so long as error free regions can be found. As such, the amount of time needed before repairs are required due to memory failures can be extended until it is no longer possible to find an error tree SCS region, assuming that a cache half line is never affected by more than one chip failure.

Figure 5:
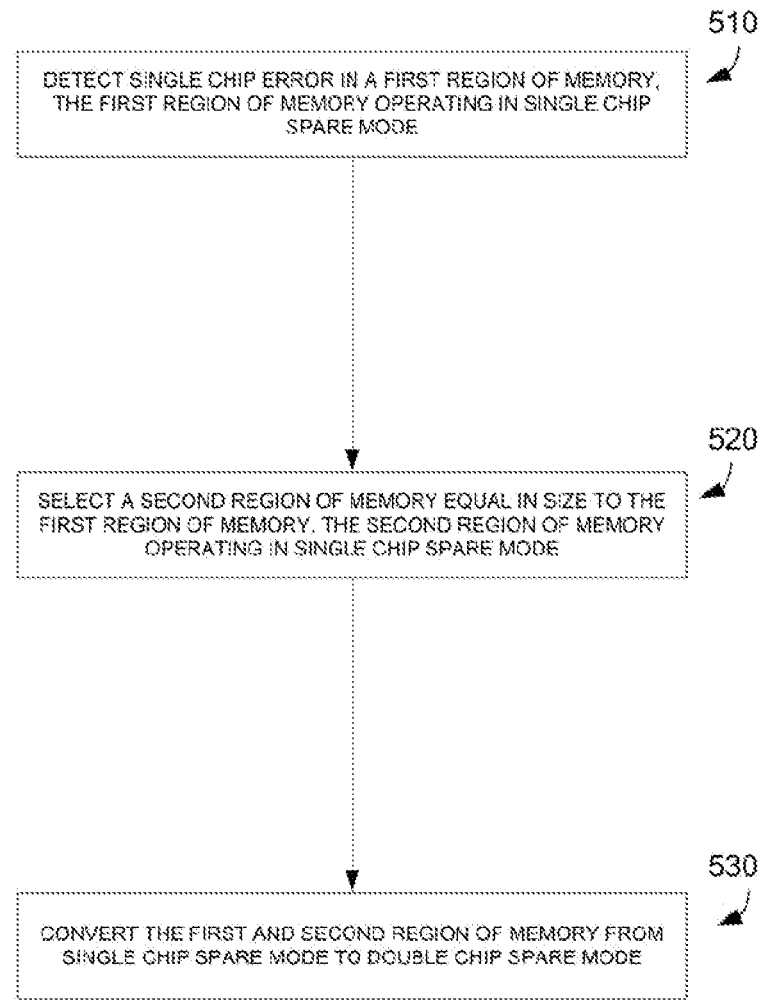
FIG. 5 depicts an example flow diagram recovering from a chip failure.

FIG. 5 depicts an example flow diagram of recovering from a chip failure. In block 510 a single chip error in a first region of memory that is operating in single chip spare mode is detected. Such an error may be detected by the memory controller through the use of error correction codes. In block 520 a second region of memory equal in size to the first region of memory is selected. The second region of memory may also operate in single chip spare mode. In some cases, the second region of memory may be the same range of memory addresses on a different bus. In other cases, the second region of memory may be a different range of memory addresses, either on the same or a different bus. In block 530 the first and second regions of memory may be converted from single chip spare mode to double chip spare mode.

Figure 6:
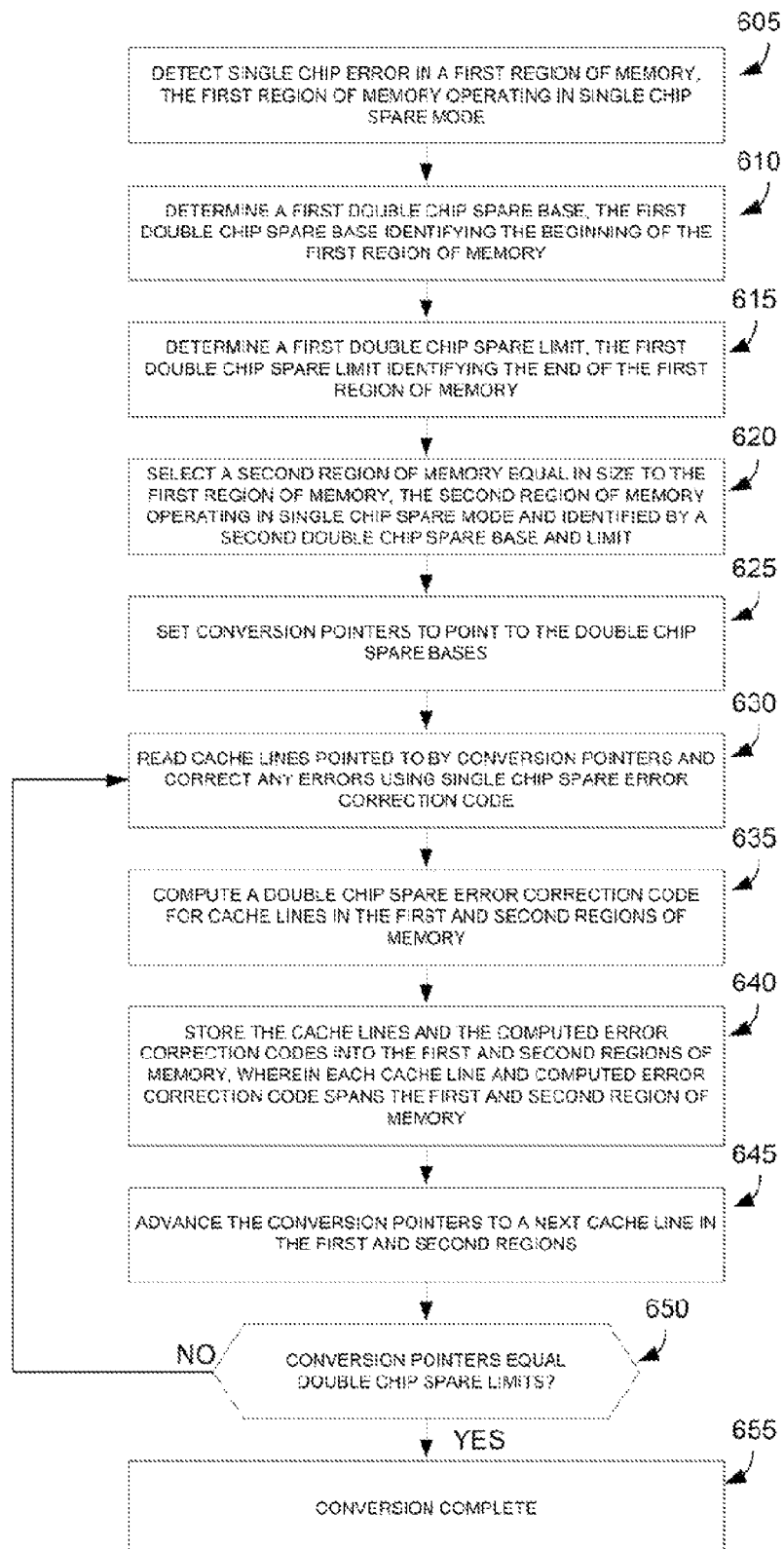
FIG. 6 depicts another example flow diagram of recovering from a chip failure.

FIG. 6 depicts another example flow diagram of recovering from a chip failure. In block 605 a single chip error in a first region of memory that is operating in single chip spare mode is detected. In block 610 a first double chip spare base is determined. The first double chip spare base identifies the beginning of the first region of memory. In block 615 a first double chip spare limit is determined. The first double chip spare limit identifies the end of the first region of memory.

In block 620 a second region of memory equal in size to the first region of memory is selected. The second region of memory operates in the single chip spare mode. The second region of memory may be identified by a second double chip spare base and a second double chip spare limit. In block 625, conversion pointers are set to the first and second double chip spare bases. In block 630 the two cache lines pointed to by the conversion pointers are read and any errors are corrected using a single chip spare error correction code. In block 635 a double chip spare error correction code is computed for cache lines in the first and second regions of memory. For example, the two cache lines may be read and any necessary correction performed using the SCS ECC. A new DCS ECC may then be computed for each cache line. The cache lines and newly computed DCS ECC are stored, as described below.

In block 640 the cache lines and the computed error correction codes are stored into the first and second regions of memory. The cache lines and computed error correction codes span the first and second region of memory In block 645 the conversion pointers are advanced to the next cache lines. In block 650 it is determined it the conversion pointers equal the double chip spare limits. If not, the process returns to block 630. Otherwise, the process moves to block 655, in which the conversion is complete.

It should be noted that cache lines may continue to be accessed while the conversion is in progress. The cache lines are accessed based on the double chip spare bases, limits, and conversion pointers. As explained above, cache lines above the conversion pointer are accessed in SCS mode, those below are accessed in DCS mode, and if equal, access requests are stalled.

Figure 7:
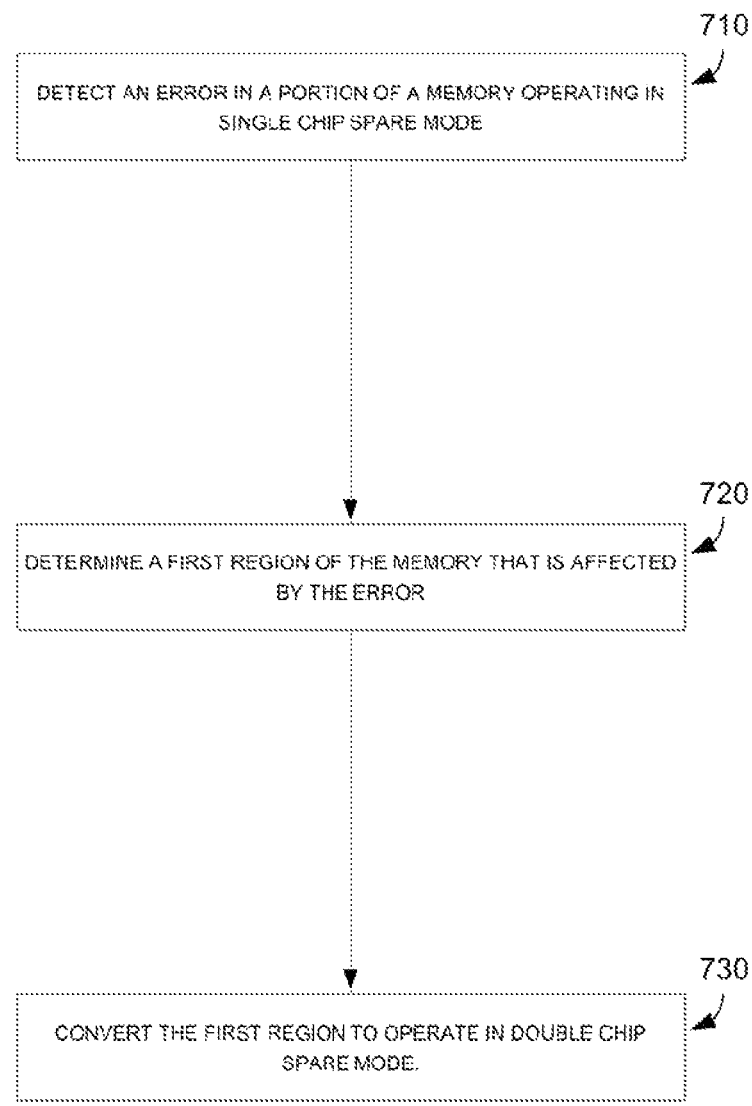
FIG. 7 depicts an example flow diagram of recovering from chip failure.

FIG. 7 depicts an example flow diagram of recovering from a chip failure. In block 710 an error in a portion of a memory operating in a single chip spare mode is detected. The error may be detected through the use of error correcting codes. In block 720 a first region of the memory that fully covers the error may be determined. For example, the error may be on a single bank of a memory chip, resulting in the size of the bank being the size of the region. As another example, the error may be on the entire chip. In block 730 the first region is converted to operate in double chip spare mode.

Figure 8:
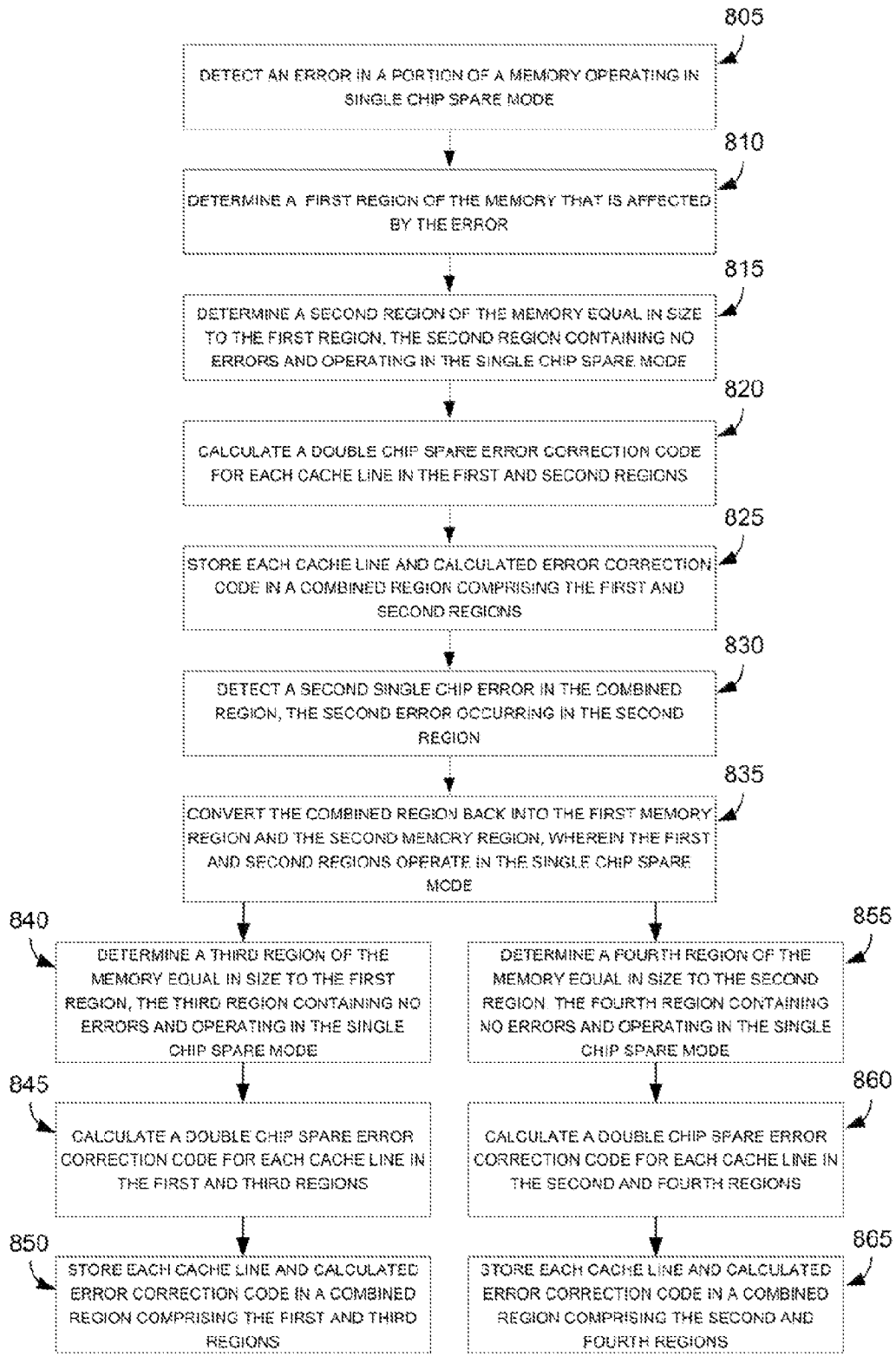
FIG. 8 depicts an ex pie flow diagram of recovering from multiple chip failures.

FIG. 8 depicts an example flow diagram of recovering from multiple chip failures. In block 805 an error is detected in a portion of a memory operating in single chip spare mode. In block 810 a first region of the memory that is affected by the error is determined. In block 815 a second region of memory equal in size to the first region is determined. The second region of memory contains no errors and is operating in the single chip spare mode.

In block 820 a double chip spare error correction code is calculated for each cache line in the first and second regions. For example, each cache line may be read and any necessary correction performed using the SCS ECC. A DCS ECC may then be calculated for each cache line. In block 825 each cache line and calculated error correction code is stored in a combined region The combined region comprises the first and second regions. In block 830 a second single chip error in the combined region is detected. The second error occurs in the second region. In block 835 the combined region is converted back into the first memory region and the second memory region. The first and second memory regions operate in the single chip spare mode.

In block 840 a third region of memory equal in size to the first region, containing no errors, and operating in the single chip spare mode is determined. In block 845 a double chip spare error correction code for each cache line in the first and third regions is calculated. Again, each cache line may be read and any necessary correction performed using the SCS ECC. A DCS ECC may then be calculated for each cache line. In block 850 each cache line and calculated error correction code is stored in a combined region that comprises the first and third regions.

In block 855 a fourth region of memory equal in size to the second region, containing no errors, and operating in the single chip spare mode is determined. In block 860 a double chip spare error correction code for each cache line in the second and fourth regions is calculated. Again, each cache line may be read and any necessary correction performed using the SCS ECC. A DCS ECC may then be calculated for each cache line. In block 865 each cache line and calculated error correction code is stored in a combined region that comprises the second and fourth regions.

We claim:

1. A device comprising:
   a memory controller to:
      access a first portion of a memory, the first portion of the memory operating in single chip spare mode; and
      access a second portion of the memory, the second portion of the memory operating in double chip spare mode, wherein the second portion of the memory operating in double chip spare mode includes a plurality of memory chips, a first portion of the plurality of memory chips and a second portion of the plurality of memory chips being accessed on different memory busses.

2. The device of claim 1, wherein the memory controller is a memory controller to:
   detect an error in a first region of the first portion of the memory; and
   convert the first region containing the error to operate in double chip spare mode.

3. The device of claim 1, wherein the memory controller is a memory controller to:
   detect an error in a first region of the first portion of the memory;
   select a second region in the first portion of the memory, the second region equal in size to the first region; and
   convert cache lines between the first and second regions to form a third region, the third region operating in double chip spare mode.

4. The device of claim 3 wherein the first and second regions of the memory are on a single memory bus.

5. The device of claim 3 wherein the first region is on a first memory bus and the second region is on a second memory bus.

6. The system of claim 1, wherein the memory controller is to detect and correct two memory chip failures in an error correcting code (ECC) codeword in the second portion of the memory when the second portion of the memory is operating in double chip spare mode.

7. A method comprising:
   detecting a single chip error in a first region of memory, the first region of memory operating in single chip spare mode;
   selecting a second region of memory equal in size to the first region of memory, the second region of memory operating in single chip spare mode;
   computing a double chip spare error correction code for cache lines in the first and second regions of memory;
   storing the cache lines and the computed error correction codes into the first and second regions of memory, wherein each cache line and computed error correction code spans the first and second region of memory; and
   converting the first and second region of memory from single chip spare mode to double chip spare mode.

8. The method of claim 7 further comprising:
   determining a first double chip spare base, the first double chip spare base identifying the beginning of the first region of memory;
   determining a first double chip spare limit, the double chip spare limit identifying the end of the first region of memory;
   determining a second double chip spare base, the second double chip spare base identifying the beginning of the second region of memory;
   determining a second double chip spare limit, the second double chip spare limit identifying the end of the second region of memory;
   setting conversion pointers to point to the first and second double chip spare bases; and
   while the conversion pointers are less than the first and second double chip spare limits:
      read cache lines pointed to by the conversion pointers and correct any errors using single chip spare error correction codes; and
      advancing the conversion pointers to a next cache line in the first and second regions.

9. The method of claim 8 wherein access of cache lines above the double chip spare bases and below the conversion pointers are in double chip spare mode.

10. The method of claim 8 wherein access of cache lines above the conversion pointers and below the double chip spare limits are in single chip spare mode.

11. The method of claim 8 wherein access of the cache lines pointed to by the conversion pointers is rejected and retried at a later time.

12. The method of claim 7, comprising:
    correcting, by a memory controller, two memory chip failures in an error correcting code (ECC) codeword in at least one of the first and second region of memory operating in double chip spare mode.

13. A method comprising:
    detecting, by a memory controller, an error in a portion of a memory operating in single chip spare mode;
    determining, by the memory controller, a first region of the memory that is affected by the error; and
    converting, by the memory controller, the first region to operate in double chip spare mode, the memory controller being capable of detecting and correcting two memory chip failures in an error correcting code (ECC) codeword in the first region operating in double chip spare mode.

14. The method of claim 13 wherein converting the first region further comprises:
    determining a second region of the memory equal in size to the first region, the second region containing no errors and operating in the single chip spare mode;
    calculating a double chip spare error correction code for each cache line in the first and second regions;
    storing each cache line and calculated error correction code in a combined region comprising the first and second regions.

15. The method of claim 14 further comprising:
    detecting a second single chip error in the combined region, the second error occurring in the second region;
    converting the combined region back into the first memory region and the second memory region, wherein the first and second regions operate in the single chip spare mode;
    determining a third region of the memory equal in size to the first region, the third region containing no errors and operating in the single chip spare mode;
    calculating a double chip spare error correction code for each cache line in the first and third regions;
    storing each cache line and calculated error correction code in a combined region comprising the first and third regions.

16. The method of claim 15 further comprising:
  determining a fourth region of the memory equal in size to the second region, the fourth region containing no errors and operating in the single chip spare mode;
  calculating a double chip spare error correction code for each cache line in the second and fourth regions;
  storing each cache line and calculated error correction code in a combined region comprising the second and fourth regions.

17. The method of claim 13, wherein converting the first region to operate in double chip spare mode includes:
  determining a first address within the first region to be a double chip spare base address; and
  determining a second address within the first region to be a double chip spare limit address, the second address being different from the first address.

18. The method of claim 17, wherein converting the first region to operate in double chip spare mode includes:
  setting a conversion pointer to point to a third address within the first region, the third address being between the first address and the second address.

* * * * *